United States Patent [19]

Taylor

[11] 4,110,568

[45] Aug. 29, 1978

[54] DUAL TONE MULTIFREQUENCY GENERATOR

[75] Inventor: Michael G. C. Taylor, Grobbendonk, Belgium

[73] Assignee: GTE ATEA, S.A., Herentals, Belgium

[21] Appl. No.: 816,121

[22] Filed: Jul. 15, 1977

[30] Foreign Application Priority Data

Oct. 8, 1976 [BE] Belgium .................................. 55355

[51] Int. Cl.² ............................................. H04Q 9/12
[52] U.S. Cl. ................................ 179/84 VF; 331/179
[58] Field of Search ...................... 179/84 VF, 90 K; 331/48, 179; 330/86, 110

[56] References Cited

U.S. PATENT DOCUMENTS

| 3,424,870 | 1/1969 | Breeden .......................... 179/84 VF |
| 3,699,477 | 10/1972 | McKell ............................... 331/179 |

OTHER PUBLICATIONS

Electronic Design, No. 24, Nov. 22, 1970, p. 60, "Ideas for Design".

Primary Examiner—Kathleen H. Claffy
Assistant Examiner—Joseph A. Popek
Attorney, Agent, or Firm—Douglas M. Gilbert

[57] ABSTRACT

A DTMF generator includes a high gain differential amplifier having a noninverting input, an inverting input, and an output. A first audio oscillator connects to the inverting input of the amplifier via a first series of frequency determining components. A second audio oscillator connects to the amplifier output via a second series of frequency determining components. The noninverting input of the amplifier connects to ground. A plurality of SPST switches interconnects the first and second frequency determining components, such that when any particular switch is closed, a unique feedback path is established from the amplifier output to the inverting input. This causes a ground potential to exist at the contacts of the particular closed switch thereby forcing both oscillators to turn on.

5 Claims, 1 Drawing Figure

DUAL TONE MULTIFREQUENCY GENERATOR

This invention relates to telephone set signalling circuits and more particularly to dual tone multifrequency (DTMF) generators.

The user of a DTMF telephone "dials" by depressing pushbutton switches in the appropriate order for the desired number. Electrically each switch causes two separate connections to be made. This usually necessitates the use of a double-pole single-throw switch. In one embodiment of the invention disclosed herein, a novel DTMF generator requires only single-pole single-throw (SPST) switches for these pushbuttons. Such an improvement reduces the overall cost and complexity of the assembly.

According to one embodiment of this invention, a DTMF generator includes first and second oscillators. The first oscillator connects through a number of series of resistors to the inverting input of a high gain differential amplifier. The second oscillator connects through a number of series of resistors to the output of the same differential amplifier, Twelve SPST switches, arranged in 3×4 touchpad matrix, interconnect the two sets of series resistors. When depressed the switch and resistors form a feedback path for the amplifier. The closed switch contacts become a potential summing point for the amplifier. The summing point is driven to a virtual ground potential by virtue of the closed loop amplifier configuration. This causes both oscillators to turn on. The virtual ground also isolates the two oscillator outputs.

The foregoing features of this invention will be fully understood from the following description of an illustrative embodiment taken in conjunction with the accompanying drawing.

DETAILED DESCRIPTION

Figure 1:
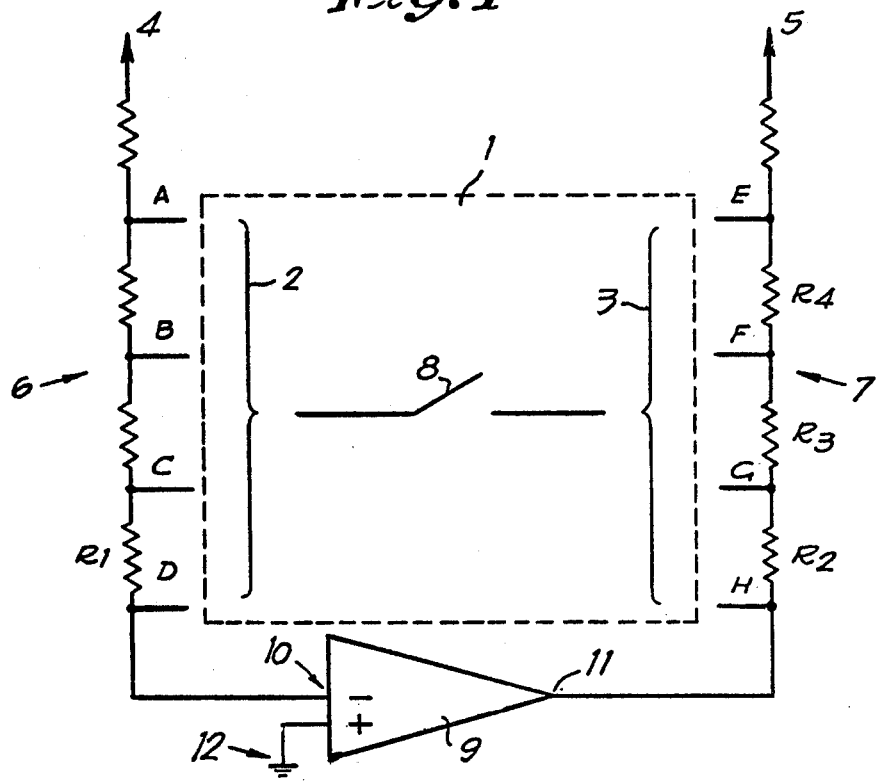
FIG. 1 is a schematic drawing of a DTMF generator for use in a telephone set.

As illustrated in FIG. 1, a simple matrix-type keypad for a telephone set is illustrated and comprises rows 2 and columns 3 of conductors. The row 2 conductors are connected to a first oscillator 4 and the column 3 conductors to a second oscillator 5, via frequency determining components (resistors) 6 and 7 respectively. A simple make-contact 8 (SPST) is provided at each crosspoint of rows and columns.

The oscillators 4 and 5 are interconnected, beyond the frequency determining components 6 and 7, through a high gain differential amplifier 9, more specifically via the inverting input 10 and output 11 of the latter. An operational amplifier would operate satisfactorily in this application. The non-inverting input of the amplifier is connected to ground at 12.

When a switch 8 is closed, for example connecting nodes C and G, the oscillators 4 and 5 both begin oscillating momentarily at a common frequency due to their interconnection. As a voltage appears at node C, a current is supplied through component $R_1$ to the input of amplifier 9. This causes a voltage of opposite polarity to appear at the output of amplifier 9 which in turn establishes a current through $R_2$ to G.

Amplifier 9 is chosen to have sufficient gain and voltage capability, so that its output current is larger than the input one. It ensues that the part of the output current which flows through contact 8 from G to C cancels the current from C through $R_1$ to the input 10 of the amplifier 9. The latter thus controls node C so that node C has only a very small voltage and is virtually a signal ground (i.e. the same as terminal 12).

As node C is connected through a low resistance contact to point G, the latter will also be a virtual signal ground. Thus, both oscillators 4 and 5 have their frequency determining components connected to ground which causes both oscillators to operate. In this manner, there are two oscillations with no interaction between said oscillators. The frequency of oscillation of oscillators 4 and 5 are dependent on the values of series resistors 6 and 7 since the resistance from the oscillators to ground sets the frequency.

It is clear that amplifier 9 must be chosen so that its input impedance is too high to allow oscillation of oscillator 4, when no contact is made. Other amplifier requirements are that its output impedance is too high to allow oscillation of oscillator 5, when no contact is made; and its output, when a contact is made, must be capable of driving, through components 7, the peak signal current needed by oscillators 4 and 5, so as to drive the summing point to a virtual ground.

It is evident that the invention is not limited to the configuration hereabove described. Instead of being grounded (zero signal) as in the example hereabove, the first channel 12 could be connected, in another field of application, to an effective signal source, the signal of which being then added to the other two channels in a manner similar to that described above.

What is claimed is:

1. A dual tone multifrequency generator for use in a telephone set, comprising:
    a high gain differential amplifier having a noninverting input, an inverting input, and an output;
    a source of reference ground potential connected to said noninverting input;
    a first oscillator means connected to said inverting amplifier input via a first plurality of series connected frequency determining components, said oscillator generating a first output signal when a path to ground potential is established through said frequency determining components, and said first output signal having a frequency determined by the impedance from said first oscillator to ground potential;
    a second oscillator means connected to said amplifier output via a second plurality of series connected frequency determining components, said oscillator generating a second output signal when a path to ground potential is established through said second plurality of frequency determining components, and said second output signal having a frequency determined by the impedance from said second oscillator to ground potential; and
    a plurality of single-pole single-throw switches interconnecting said first and second plurality of frequency determining components such that when any particular switch is closed a unique feedback path is established from said amplifier output to said amplifier inverting input causing a ground potential to exist at said particular switch and thereby causing both first and second oscillators to operate.

2. A dual tone multifrequency generator as in claim 1 wherein: said first plurality of frequency determining components comprises four series resistors; and said second plurality of frequency determining components comprises four series resistors.

3. A dual tone multifrequency generator as in claim 2 wherein said amplifier comprises an operational amplifier.

4. A dual tone multifrequency generator as in claim 3 wherein said first and second oscillator means comprises first and second audio oscillators.

5. A dual tone multifrequency generator as in claim 4 wherein said plurality of switches comprises 12 SPST pushbutton switches connected in a 3 × 4 matrix arrangement.

* * * * *